(12) United States Patent
Goldbach et al.

(10) Patent No.: US 7,622,374 B2
(45) Date of Patent: Nov. 24, 2009

(54) METHOD OF FABRICATING AN INTEGRATED CIRCUIT

(75) Inventors: Matthias Goldbach, Dresden (DE); Jürgen Holz, Dresden (DE)

(73) Assignee: Infineon Technologies AG, Munich (DE)

( * ) Notice: Subject to any disclaimer, the term of this patent is extended or adjusted under 35 U.S.C. 154(b) by 229 days.

(21) Appl. No.: 11/320,489

(22) Filed: Dec. 29, 2005

(65) Prior Publication Data

US 2007/0155102 A1    Jul. 5, 2007

(51) Int. Cl.
*H01L 21/38* (2006.01)
*H01L 21/22* (2006.01)

(52) U.S. Cl. ......... 438/550; 257/E21.12; 257/E21.454; 257/E21.691; 438/266

(58) Field of Classification Search ............ 257/E21.12, 257/E21.454, E21.691; 438/266, 550
See application file for complete search history.

(56) References Cited

U.S. PATENT DOCUMENTS

| | | | |
|---|---|---|---|
| 4,431,459 A | 2/1984 | Teng | |
| 4,918,051 A | 4/1990 | Mantese | |
| 4,983,577 A | 1/1991 | Mantese | |
| 5,094,977 A | 3/1992 | Yu | |
| 5,393,685 A | 2/1995 | Yoo | |
| 5,405,804 A | 4/1995 | Yabe | |
| 5,514,877 A * | 5/1996 | Nakamura et al. | ............ 257/34 |
| 5,773,329 A | 6/1998 | Kuo | |
| 5,814,165 A | 9/1998 | Tatah | |
| 5,953,633 A | 9/1999 | Chen | |
| 5,956,603 A | 9/1999 | Talwar | |
| 6,036,770 A * | 3/2000 | Chandra et al. | ................ 117/2 |
| 6,143,241 A | 11/2000 | Hajaligol | |
| 6,291,302 B1 | 9/2001 | Yu | |
| 6,355,544 B1 * | 3/2002 | Essaian et al. | ............. 438/535 |
| 6,365,446 B1 | 4/2002 | Chong | |
| 6,536,237 B1 | 3/2003 | Jung | |
| 6,605,513 B2 | 8/2003 | Paton | |
| 6,607,971 B1 | 8/2003 | Moriguchi | |
| 6,624,489 B2 | 9/2003 | Chong | |
| 6,706,576 B1 | 3/2004 | Ngo | |
| 6,727,125 B2 | 4/2004 | Adachi | |
| 6,777,276 B2 | 8/2004 | Crowder | |
| 6,794,279 B1 | 9/2004 | Stephen | |
| 6,841,441 B2 | 1/2005 | Ang | |
| 6,897,118 B1 | 5/2005 | Poon | |
| 7,112,846 B2 * | 9/2006 | Wolfe et al. | ................. 257/347 |
| 2002/0068408 A1 | 6/2002 | Paton | |
| 2002/0098689 A1 | 7/2002 | Chong | |

(Continued)

FOREIGN PATENT DOCUMENTS

AU        767201 B2        8/2000

(Continued)

*Primary Examiner*—Asok K Sarkar
(74) *Attorney, Agent, or Firm*—Patterson & Sheridan, L.L.P.

(57) ABSTRACT

Methods of fabricating an integrated circuit, in particular a dynamic random access memory are described. After forming memory cells on a semiconductor substrate a mirror layer is provided, said mirror layer covering the memory cells. Then logic devices are formed adjoining to said memory cells covered by said mirror layer, said forming of said logic devices including activating the dopants in dopant regions by means of a radiation annealing, said radiation being reflected by said mirror layer. After at least partly removing the mirror layer; a wiring of the memory cells and of the logic devices is formed.

15 Claims, 4 Drawing Sheets

U.S. PATENT DOCUMENTS

| | | |
|---|---|---|
| 2002/0192914 A1 | 12/2002 | Kizilyalli |
| 2003/0196589 A1 | 10/2003 | Mitani |
| 2003/0199176 A1 | 10/2003 | Adachi |
| 2004/0043606 A1 | 3/2004 | Crowder |
| 2004/0132271 A1 | 7/2004 | Ang |
| 2004/0180144 A1 | 9/2004 | Nagashima |
| 2004/0197972 A1 | 10/2004 | Adachi |
| 2004/0224447 A1 | 11/2004 | Adachi |
| 2005/0059171 A1 | 3/2005 | Lai |
| 2005/0101083 A1 | 5/2005 | Ang |

FOREIGN PATENT DOCUMENTS

| | | |
|---|---|---|
| AU | 5971701 | 12/2001 |
| AU | 2002233412 | 7/2003 |
| CA | 2362302 A1 | 8/2000 |
| DE | 4142466 A1 | 6/1993 |
| EP | 0098343 A3 | 1/1984 |
| EP | 1165276 | 8/2000 |
| EP | 1297563 | 4/2003 |
| GB | 2390224 A | 12/2003 |
| GB | 2396481 A | 6/2004 |
| JP | 57183024 A | 11/1982 |
| JP | 58000133 A | 1/1983 |
| JP | 58114435 A | 7/1983 |
| JP | 59112617 A | 6/1984 |
| JP | 62216320 A | 9/1987 |
| JP | 63292619 A | 11/1988 |
| JP | 1256114 A | 10/1989 |
| JP | 1283917 A | 11/1989 |
| JP | 4370925 A | 12/1992 |
| JP | 548190 A | 2/1993 |
| JP | 5152312 A | 6/1993 |
| JP | 9171971 A | 6/1997 |
| JP | 1070077 A | 3/1998 |
| JP | 1098251 A | 4/1998 |
| JP | 10335256 A | 12/1998 |
| JP | 2001-185504 A | 7/2001 |
| JP | 2002-270536 A | 9/2002 |
| JP | 2002-289525 A | 10/2002 |
| JP | 2003-51596 A | 2/2003 |
| JP | 2003-309080 A | 10/2003 |
| JP | 2003-318111 A | 11/2003 |
| JP | 2004-311618 A | 11/2004 |
| WO | WO-00/13213 A1 | 3/2000 |
| WO | WO-00/47354 C2 | 8/2000 |
| WO | WO-01/91168 A1 | 11/2001 |
| WO | WO-02/47145 A1 | 6/2002 |
| WO | WO-03/060185 A1 | 7/2003 |

* cited by examiner

METHOD OF FABRICATING AN INTEGRATED CIRCUIT

TECHNICAL FIELD OF THE INVENTION

The present invention generally refers to a method of fabricating an integrated circuit (IC) and more particularly an dynamic random access memory (DRAM).

BACKGROUND OF THE INVENTION

Semiconductor memories are widely used in electronic systems for storing data. A common type of a semiconductor memory is a dynamic random access memory (DRAM). A DRAM typically includes millions or billions of individual DRAM memory cells, each cell storing one bit of data. A DRAM memory cell typically includes an access field effect transistor (FET) and a storage capacitor. The access FET allows transfer of data charge to and from the storage capacitor during read and write operation. In addition the data charge on the storage capacitor is periodically refreshed via the access FET during a refresh operation.

The semiconductor industry is being driven to decrease a size of memory cells located on a semiconductor memory. The miniaturization is generally needed to accommodate the increasing density of circuits necessary for today's semiconductor memories.

The desire of even higher level of circuit integration has stimulated three-dimensional integration of the memory cells in particular of the storage capacitors. Three-dimensional storage capacitors such as deep trench capacitors or stack capacitors are now extensively used in memory cells to reduce the cell array.

Semiconductor memories exist not only a stand-alone memory cell array but are also embedded in processor chips including support devices. The performance of embedded memory cell array in particular with respect to its signal speed is improved since bandwidth problems are reduced due to the elimination of an interface circuitry and of package leads. In future semiconductor market embedded high-speed memories become even more important. The desire of an increased speed of the memory devices can be notably achieved by shrinking the support devices.

The individual components of both the memory cell array and the support devices are generally realized by means of silicon planar technique. The silicon planar technique comprises a sequence of process steps, each process step acting over the whole area of a semiconductor surface and by means of suitable masking layers leading in a targeted manner to a local alteration of the semiconductor material to form the components.

A process of manufacturing an integrated circuit comprises hundreds of process steps which may be divided into three main sections: a front end of line (FEOL) process, a middle of line process (MOL) and a back end of line process (BEOL). During the FEOL processing the electronic devices of the integrated circuit are formed. In a standard process of manufacturing a DRAM memory the FEOL processing include forming the memory cell array, each memory cell including an access FET and a storage capacitor. Concurrently the logic devices in particular logic transistors of the support region are formed.

In the standard DRAM processing the MOL processing is almost completed with a so-called retention anneal step. Said retention anneal step is performed to remove crystal defects especially in the capacitor regions of the memory cells whereby a retention time of the DRAM cell is set and thus the functionality of the DRAM cell is ensured. Said retention anneal process is usually a furnace anneal process wherein temperature is rammed up to temperatures higher than approximately 800° C.

The circuit wiring is subsequently provided during the BEOL processing which usually starts with the formation of a contact layer (metallization 0) of the integrated circuit.

In a standard DRAM process the MOL processing includes a deposition of a diffusion layer covering both the memory cell array and the support region. On top of the diffusion layers a dielectric layer preferable an BPSG layer is provided which is exposed to a heating step to make it flow so that a densification of the layer takes place. The BPSG layer is subsequently planarised preferable by means of a chemical mechanical polishing process.

In the BEOL processing of the DRAM succeeding the MOL processing contact plugs to contact the access FETs of the memory cells and the logic devices of the support region are formed establishing a first metallization plane (metallization 0). Then further metallization layers are disposed to interconnect memory cells and the logic devices to enable access for reading and writing operations of the memory cells controlled by the logic devices.

In order to form integrated circuits having high speed support devices with a small layout it is necessary to create device junctions having sharp borderlines and a small penetration depth, so-called ultra-shallow junctions. Moreover, logic devices in the support region of DRAM memories having improved electrical characteristics are achieved by employing new materials such as high-k dielectrics in the capacitor. However, both ultra-shallow junctions and high-k dielectics usually stands a limited maximum temperature. In the standard process of manufacturing DRAM memories however the final retention anneal is carried out with temperatures of more than 800° C. Such a high maximum temperature damages ultra-shallow junctions causing a dopant diffusion which results in a high junction leakage. Moreover many high-k dielectics lose their improved electrical characteristics when applying a temperature above 800° C.

SUMMARY OF THE INVENTION

It is an object of the present invention to provide a method of fabricating an improved integrated circuit including first devices and second devices, said first devices having a limited thermal stability.

It is a further object of the present invention to provide a method of fabricating an integrated circuit having memory cells and logic devices, said memory cells having a limited thermal stability.

It is a further object of the present invention to provide a method of fabricating an integrated circuit including a dynamic memory cell array and logic transistor devices, said dynamic memory cells having a defined charge retention time and said logic transistor devices having ultra-shallow junctions.

With the foregoing and other objects in view there is provided in accordance with the invention a method of fabricating an integrated circuit. The method includes the following steps. The first step is providing a semiconductor substrate. The subsequent step is processing the semiconductor substrate to form first devices. The next step is providing a mirror layer on the semiconductor substrate, the mirror layer covering the first devices. The next step is processing the semiconductor substrate to form second devices adjoining to said first devices covered by said mirror layer, said forming of the second devices including a radiation annealing, said radiation being reflected at least partly by said mirror layer. After that the mirror layer is at least partly removed. The final step is processing the semiconductor substrate to form a wiring of the first devices and of the second devices.

The objects of the invention and other objects in view there is also provided a method of fabricating an integrated circuit including the following steps. The first step is providing a semiconductor substrate. The second step is processing the semiconductor substrate to form memory cells. The next step is providing a mirror layer on the semiconductor substrate, mirror layer covering the memory cells. In a subsequent step the semiconductor substrate is processed to form logic devices adjoining to said memory cells covered by said mirror layer, said forming of said logic devices including activating the dopants in dopant regions by means of a radiation annealing, said radiation being reflected by said mirror layer. The next step is partly removing the mirror layer. The final step is processing the semiconductor substrate to form a wiring of the memory cells and of the logic devices, said remaining parts of the mirror layer being part of the wiring of the memory cells.

With the objects of the invention and other objects in view there is also provided a method of fabricating an integrated circuit including the following steps. The first step is providing a semiconductor substrate. In a subsequent step the semiconductor substrate is processed to form a dynamic memory cell array including a plurality of memory cells, each memory cell having a storage capacitor and an access transistor with two source/drain regions and a gate region. A subsequent step is a retention annealing of a semiconductor memory cells. Then a mirror layer is provided on the semiconductor substrate, said mirror layer covering the memory cell array. In a subsequent step the memory substrate is processed to form logic transistor devices adjoining to said memory cells covered by said mirror layer, said forming of the logic transistor devices including dopant regions and activating the dopants in the dopant regions by means of laser annealing or flash annealing. Then the mirror layer is at least partly removed. In a final step the semiconductor substrate is processed to form a wiring of the memory cells and of the logic transistor devices.

With the objects of the invention and other objects in view there is also provided a method of fabricating an integrated circuit including the following steps. The first step is providing a semiconductor substrate. In a subsequent step the semiconductor substrate is processed to form a dynamic memory cell array including a plurality of memory cells, each memory cell having a storage capacitor and an access transistor with two source/drain regions and a gate region. Then a retention annealing of the memory cell is carried out. In a next step a metal layer is provided on the semiconductor substrate, the metal layer covering the memory cell array and electrically contact one of the source/drain regions of the access transistors. The next step is processing the semiconductor substrate to form logic transistor devices adjoining to said memory cells covered by said metal layer, said forming of the logic transistor devices including activating the dopants in dopant regions by means of laser annealing or flash annealing. Then the metal layer is partly removed, said remaining parts of the metal layer are bit line contacts to the one source/drain regions of the access transistors. In a final step the semiconductor substrate is processed to form a wiring of the memory cells and of the logic transistor devices, said bit line contacts being part of the wiring of the memory cells.

The present invention is based on the following knowledge. When fabricating an integrated circuit including devices having a limited thermal stability, said devices having the limited thermal stability are formed first. Then said first devices having the limited thermal stability are covered by a mirror layer which at least partly reflects radiation. After that further devices are formed on the semiconductor substrate, said forming including a radiation annealing step. Since the radiation is at least partly reflected by the mirror layer covering the first devices having a limited thermal stability a heating-up of said first devices above a critical temperature is avoided. In consequence the radiation annealing step has no negative impact on the first devices having the limited thermal stability.

If the devices having said limited thermal stability are dynamic memory cells the radiation annealing does not have an effect on the memory cell retention time since said mirror layer covering said memory cells at least partly reflects the radiation during the radiation annealing. With respect to the logic devices of DRAM including dopant regions the activation of the dopants in the dopant regions is carried out by means of said radiation annealing enabling ultra-shallow junctions of the dopant regions and in consequence high speed devices having a small layout. If the logic devices are logic transistors the activation is preferably carried out by a laser annealing or a flash annealing enabling ultra-shallow junctions with sharp and shallow doping profiles and a high dopant activation resulting in a low sheet resistance.

In case the mirror layer is a metal layer the metal layer covering the memory cell array is preferably formed to electrically contact one of the source/drain regions of the access transistors of the dynamic memory cells. When removing the metal layer after forming the logic transistor devices including an activation of the dopants in the dopant regions by means of the laser annealing or the flash annealing the metal layer is only partly removed, said remaining parts of the metal layer forming contacts to one source/drain regions of the access transistors, said contacts being part of a wiring of the memory cells. In consequence the metal layer used to reduce the maximum temperature applied to the memory cells can be additionally employed as contact plugs reducing the manufacturing costs.

According to a preferred embodiment the mirror layer reflects at least 50% of the radiation to prevent a damage of temperature sensitive devices by limiting the maximum temperature applied to said devices. According to a further preferred embodiment the mirror layer forms an extended cover of said first devices or said memory cells, said mirror layer projecting at least 100 nm beyond said memory cells. This extended cover ensures that the high temperature value applied to said logic devices by means of said radiation annealing decline to a temperature value in the region of the memory cells having no negative impact on the memory cells and their retention time.

BRIEF DESCRIPTION OF THE DRAWINGS

These and other objects and features of the present invention will become clear from the following description taken in conjunction with accompanied drawings in which.

DETAILED DESCRIPTION OF THE INVENTION

The invention is explained by way of example on the basis of a process sequence of fabricating a DRAM module with a cell array region and a logic array region on a semiconductor substrate. However it can be used for other integrated circuits which have a first group of devices having a limited thermal stability.

The individual components are generally realized with the aid of silicon planar technique. The planar technique comprises a sequence of individual processes which usually acts over the whole area at the semiconductor surface and by suitable masking layers lead in a targeted manner to the local alteration of the semiconductor material. When fabricating a DRAM memory, a multiplicity of DRAM memory cells and a multiplicity of logic devices are formed at the same time.

The invention is explained by way of example on the basis of a process sequence of forming one DRAM memory cell composed of an access transistor and a storage capacitor and of forming one logic transistor of the support region. Figures in each case illustrate a cross section through the semiconductor substrate.

Figure 1:
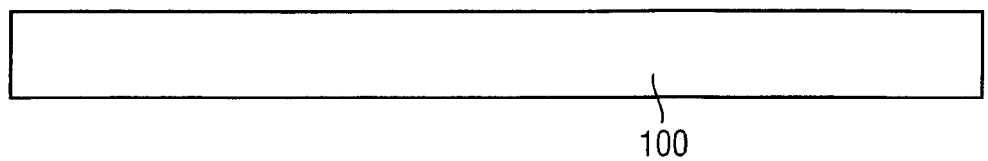
FIGS. 1 to 8 are partial, schematic and sectional views showing steps of a first embodiment of a method of fabricating an integrated circuit according to the invention.
Figure 2:
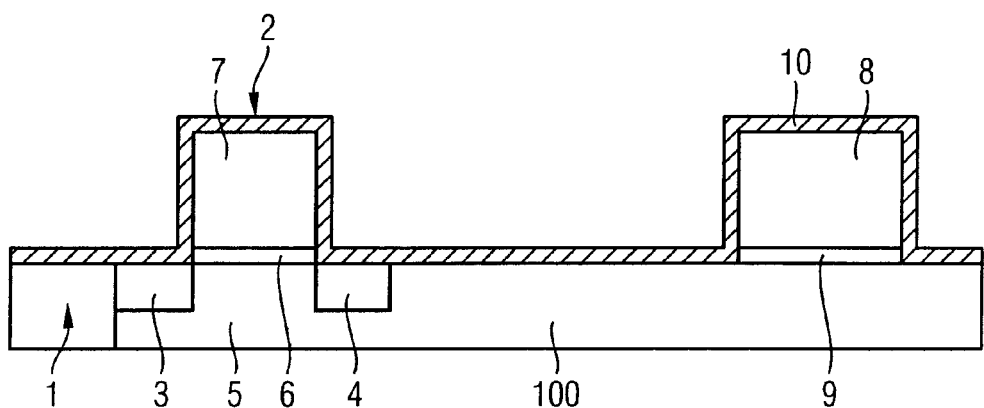

FIG. 1 shows as the starting point of a first embodiment of the method according to the invention a plain semiconductor substrate 100. In a first process sequence the semiconductor substrate is patterned by means of silicon planar technique to form a DRAM memory cell composed of a storage capacitor and an access transistor wherein reference number 1 denotes the storage capacitor and reference number 2 denotes the access transistor. The storage capacitor 1 used for storing information in form of electric charges representing a logic value such as "0" or "1" one is implemented as a trench capacitor. FIG. 2 illustrates only the inner electrode of the trench capacitor 1. The further elements of the trench capacitor are not shown.

FIG. 2 further illustrates a first source/drain region 3 of the access transistor 2 being electrically connected to the inner electrode of the trench capacitor 1. Reference number 4 denotes a second source/drain electrode 4 of the access transistor, between the first source/drain electrode 3 and the second source/drain electrode an active region 5 is arranged. On top of the active region 5 a gate insulation layer 6 and a gate electrode 7 are formed. The gate insulation layer 6 and the gate electrode 7 work like a plate capacitor with which a charge density of the active region 5 can be affected in order to open or close a current lead channel in the active region 5 between the first source/drain electrode 3 and the second source/drain electrode 4.

Being separated from the memory cell array a support region is provided on the semiconductor substrate 100, said support region being partly processed simultaneously with the memory cell array and being represented in FIG. 2 by a further gate electrode 8 provided on a further gate isolation layer 9. On top of semiconductor surface a thin layer 10 is arranged serving as a diffusion barrier.

The layout of the storage capacitor 1 of the dynamic memory cell as a trench capacitor having a three-dimensional structure results in a substantial reduction of the memory cell surface. With increasing miniaturization of the memory cells however additional measures are necessary to ensure a sufficient large storage capacity of the trench capacitor to enable a safe detection of charges stored therein.

In order to provide such a trench capacitor having a further reduced cross section new materials are employed to form the trench capacitor. To increase the capacity of the trench capacitor thin insulation layers having a high dielectric constant are used as dielectric intermediate layer between the storage capacitor electrode. These so-called high-k dielectrics are however usually not thermal stable in a temperature range above 800° C. In consequence such high-K dielectrics only stands a limited maximum temperature.

Since however the trench capacitor is formed as shown in FIG. 2 before carrying out the source/drain regions of the logic transistors forming the support devices the formation of these source/drain regions of the logic transistors should carried out with a limited maximum temperature. This in particular applies to the annealing step being necessary to activate dopants in the source/drain region of the logic transistors. To built smaller logic transistors having source/drain regions with ultra-shallow junctions however a rapid thermal annealing of the dopant regions up to a temperature above 1000° C. is necessary. Such a temperature however damages high-K dielectrics used in storage capacitors.

A temperature above 1000° C. for activating dopants in the source/drain regions of logic transistors to form ultrashallow junctions does not only have a negative impact on high-K dielectrics used in storage capacitors but also degrades the electric characteristics of the memory cells. In particular the retention time being necessary to correctly refresh the memory cells is affected by the maximum temperature. The retention time of the memory cell array is adjusted by a so-called retention annealing process as shown in FIG. 2 whereby the retention time of the memory cells is set. After carrying out said retention anneal only a limited maximum temperature should be applied to the memory cells during further processing of the integrated circuit. However any dopant activation anneal of the source/drain regions of the logic transistors to create ultra-shallow junctions would extend such a limited maximum temperature.

According to the inventive concept the maximum temperature applied to devices in an integrated circuit being temperature sensitive with their mechanical and/or electric characteristics is limited by covering said devices with a mirror layer so that annealing steps carried out by radiation annealing do not affect said temperature sensitive devices. The radiation is at least partly reflected by the mirror layer avoiding a heating-up of the temperature sensitive devices.

Figure 3:
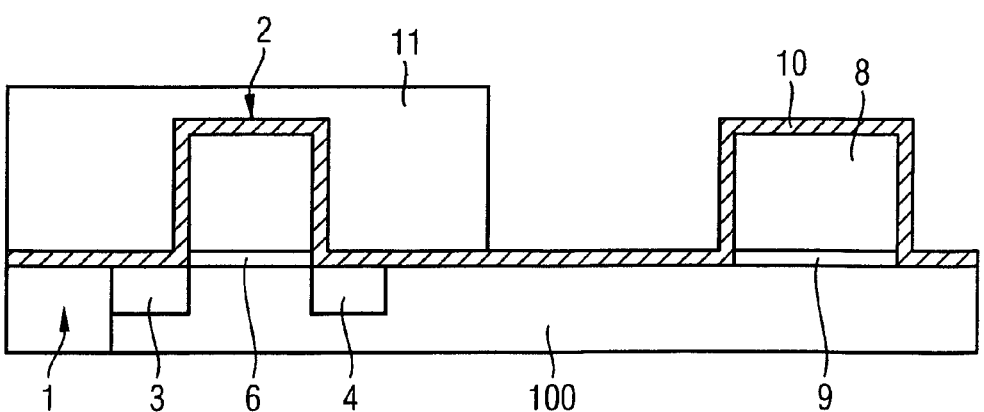

FIG. 3 illustrates a mirror layer 11 covering the temperature sensitive memory cell being composed of the trench capacitor 1 and the access transistor 2. The formation of the mirror layer 11 is preferably carried out by applying the layer to the whole semiconductor surface and then removing the mirror layer from semiconductor surface regions which should be subsequently processed. The resulting structure is shown in FIG. 3. It is preferred that the mirror layer 11 covers the memory cell on an enlarged extent so that the mirror layer projects at least 100 nm beyond said memory cell more preferable projecting at least 1 µm beyond said memory cell. Said enlarged extent of the mirror layer 11 ensures that the temperature value applied to the support region during the annealing step declines to a temperature value being sufficiently low to avoid a damage of the memory cell. To improve the reflection efficiency the mirror layer is preferably planarized after deposition as shown in FIG. 3.

Figure 4:
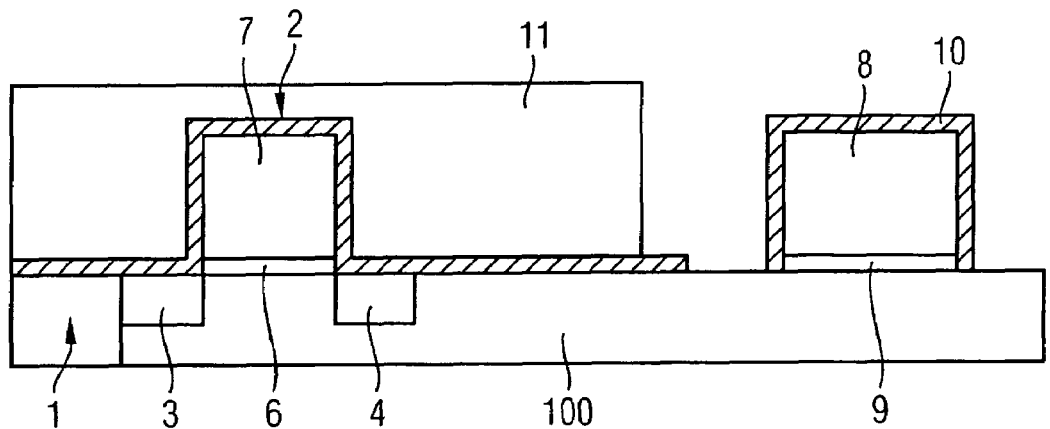
Figure 5:
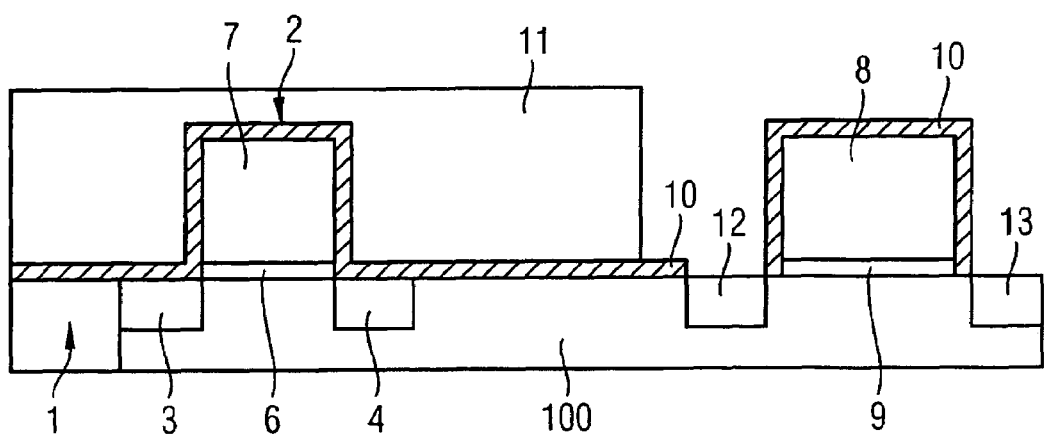

After providing the mirror layer 11 source/drain regions of the logic transistor in the support region are formed. In a first step the diffusion layer 10 is removed in defined source/drain regions as shown in FIG. 4. In a next step a doping of the source/drain regions 12, 13 of a logic transistor is carried out preferably by means of ion implantation. The structure after formation of the source/drain regions 12, 13 of the logic transistor is shown in FIG. 5.

Figure 6:
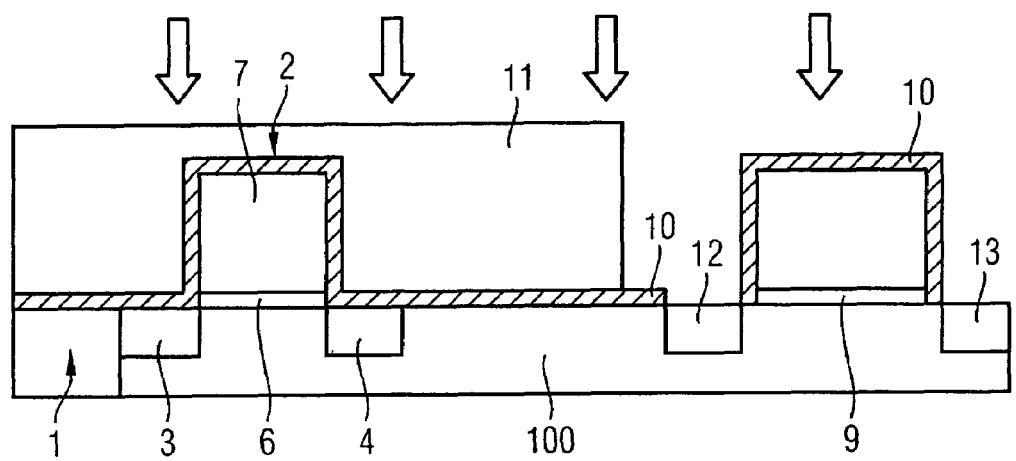

To activate the dopants in the source/drain regions 12, 13 of the logic transistor an activation anneal is carried out by radiation heating as shown in FIG. 6. The radiation anneal is preferably a flash or a laser anneal enabling a rapid heating up of the semiconductor wafer in the source/drain regions 12, 13 of the logic transistor to a temperature above 800° C. to ensure an ultra-shallow junction layout of the source/drain regions. Simultaneous heating of the memory cell is avoided by the mirror layer 11 covering said memory cell. Said mirror layer 11 is partly reflecting the radiation so that the maximum temperature applied to the memory cell during the radiation anneal of the source/drain regions 12, 13 of the logic transistor is limited to a temperature below 800° C. avoiding a degradation of the retention time of the memory cell and a destruction of high-k material possibly used in the trench capacitor 1.

To ensure a partly annealing of a semiconductor wafer the mirror layer is carried out to at least reflecting 50% of said heating. The material used for the mirror layer and the thickness of the mirror layer is selected so that the mirror layer is almost impermeable for radiation.

Figure 7:
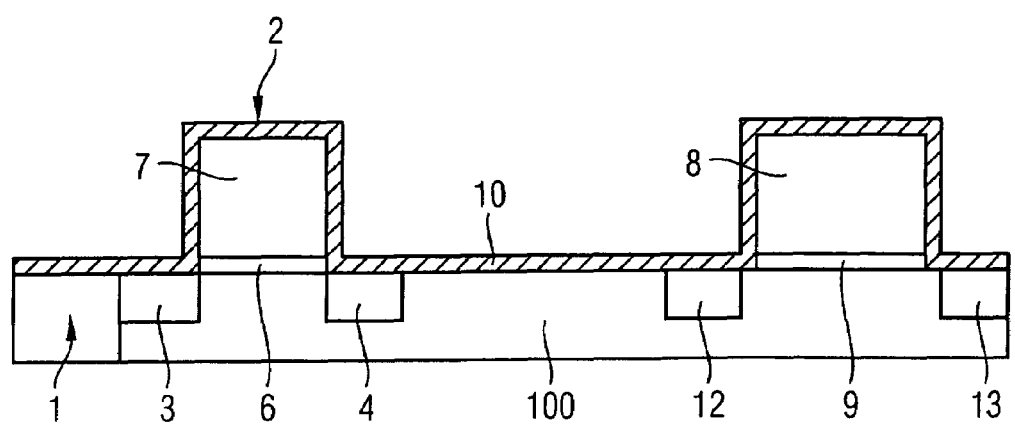
Figure 8:
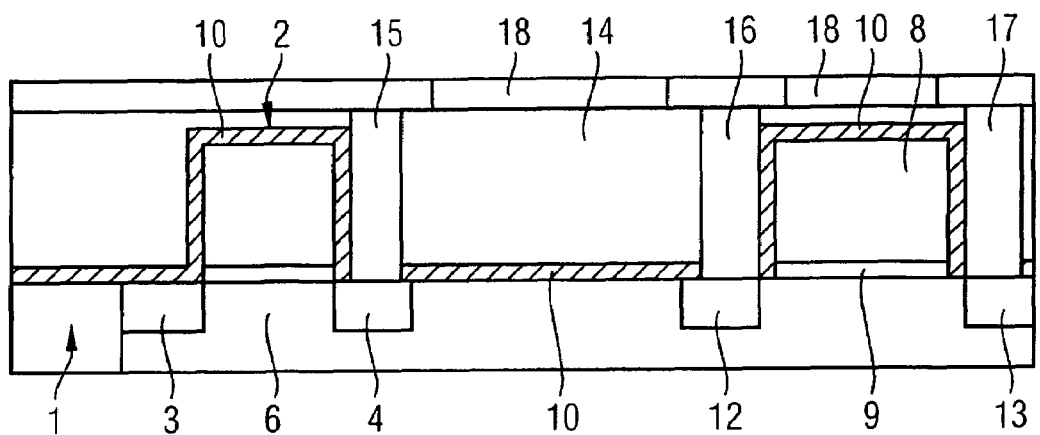

After the radiation annealing as shown in FIG. 6 the mirror layer 11 is removed and the diffusion layer 10 on the semiconductor substrate is closed again as shown in FIG. 7. In a next process sequence as shown in FIG. 8 a wiring of the memory cell and of the logic transistor is carried out. In a first step a dielectric layer 14 is deposited on the semiconductor surface. In a subsequent step contact holes 15, 16, 17 are defined in the dielectric layer 10 penetrating through said dielectric layer to contact one source/drain region 4 of the access transistor 2 of the memory cell and the source/drain regions 12, 13 of the logic transistor.

After filling said contact holes 15, 16, 17 with conductive material in a next step a second dielectric layer 18 is deposited on the surface of the first dielectric layer 114. Then a wiring structure 19 is made of a second conductive material connected to said contact plugs 15, 16, 17, said wiring being formed in the second dielectric layer 18. The layout of the integrated circuit after forming of the contact plugs 15, 16, 17 and the wiring is shown in FIG. 8.

According to the invention an integrated circuit is fabricated including first devices and second devices, said first devices having a limited maximum temperature. According to the invention a mirror layer is provided on said first devices before said second devices are formed, said forming including a heating process by radiation annealing, said radiation being reflected at least partly by said mirror layer covering the first device avoiding a heating of said first devices.

Figure 9:
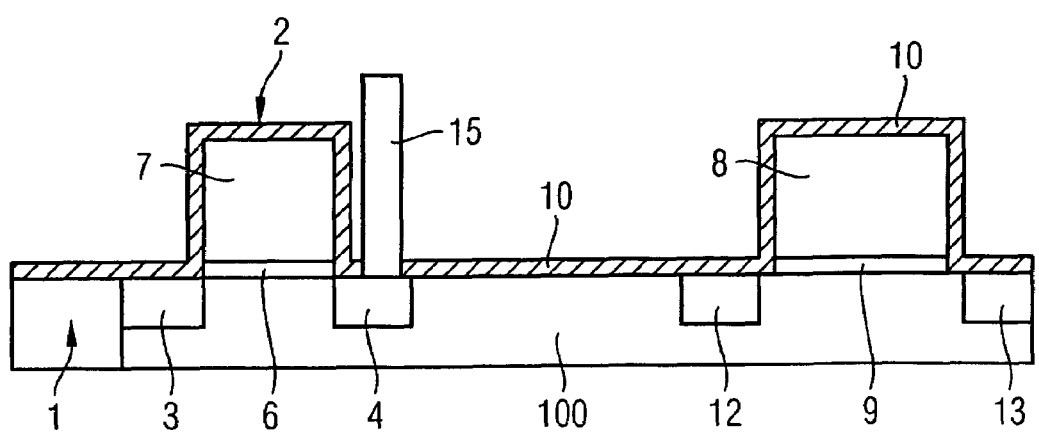
FIG. 9 is a partial, schematic and sectional views showing one step of a second embodiment of a method of fabricating an integrated circuit according to the invention.

FIG. 9 illustrates a second embodiment of the present invention. The process sequence carried out substantially correspond with a process sequence of the first embodiment. The steps of the first embodiment described in conjunction with FIGS. 1 to 6 are also applied to the second embodiment. As a mirror layer however a metal layer is applied. After activation of the dopants in the source/drain regions of the logic transistor by means of laser annealing or flash annealing the metal layer covering the memory cell during the annealing step is only partly removed, said remaining part is used as the contact plug 15 of the one source/drain region 4 of the access transistor 2 as shown in FIG. 9. By this processing a subsequent formation of the wiring is simplified since the steps of photolithographically defining the contact hole of the access transistor 2 and of filling this contact hole with metal can be dispensed.

While the foregoing description has focussed on DRAM memories the technique described herein for making integrated circuits to avoid damaging of temperature sensitive devices can be applied to any type of integrated circuits having such devices.

While the foregoing is directed to the embodiments of the present invention, other and further embodiments of the invention may be devised without departing from the basic scope thereof, and the scope thereof is determined by the claims that follow.

What is claimed is:

1. A method of fabricating an integrated circuit including the steps of:
   providing a semiconductor substrate;
   processing the semiconductor substrate to form first devices;
   providing a mirror layer on the semiconductor substrate, the mirror layer covering the first devices;
   processing the semiconductor substrate to form second devices adjoining to said first devices covered by said mirror layer, said forming of the second devices including a radiation annealing, said radiation being reflected at least partly by said mirror layer;
   at least partly removing the mirror layer; and
   processing of the semiconductor substrate to form a wiring of the first devices and of the second devices.

2. The method of claim 1, wherein said mirror layer reflects at least 50% of said radiation.

3. The method of claim 1, wherein said mirror layer is a metal layer.

4. The method of claim 1, wherein said mirror layer forms an extended cover of said first devices, said mirror layer projecting at least 100 nm beyond said first devices.

5. A method of fabricating an integrated circuit including the steps of:
   providing a semiconductor substrate;
   processing the semiconductor substrate to form memory cells;
   providing a mirror layer on the semiconductor substrate, the mirror layer covering the memory cells;
   processing the semiconductor substrate to form logic devices adjoining to said memory cells covered by said mirror layer, said forming of the logic devices including activating the dopants in dopant regions by means of a radiation annealing, said radiation being reflected at least partly by said mirror layer;
   partly removing the mirror layer; and
   processing of the semiconductor substrate to form a wiring of the memory cells and of the logic devices, said remaining parts of the mirror layer being parts of the wiring of the memory cells.

6. The method of claim 5, wherein said mirror layer reflects at least 50% of said radiation.

7. The method of claim 5, wherein said mirror layer is a metal layer.

8. The method of claim 5, wherein said mirror layer forms an extended cover of said memory cells, said mirror layer projecting at least 100 nm beyond said memory cells.

9. A method of fabricating an integrated circuit including the steps of:
   providing a semiconductor substrate;
   processing of the semiconductor substrate to form a dynamic memory cell array including a plurality of memory cells, each memory cell having a storage capacitor and an access transistor with two source/drain regions and a gate region;
   retention annealing of the semiconductor memory cells;
   providing a mirror layer on the semiconductor substrate, the mirror layer covering the memory cell array;
   processing the semiconductor substrate to form logic transistor devices adjoining to said memory cells covered by said mirror layer, said forming of the logic transistor devices including activating the dopants in dopant regions by means of laser annealing or flash annealing, said radiation being reflected at least partly by said mirror layer;

at least partly removing the mirror layer; and processing the semiconductor substrate to form a wiring of the memory cells and of the logic transistor devices.

10. The method of claim 9, wherein said mirror layer reflects at least 50% of said radiation.

11. The method of claim 9, wherein said mirror layer forms an extended cover of said dynamic memory cell array, said mirror layer projecting at least 100 nm beyond said dynamic memory cell array.

12. A method of fabricating an integrated circuit including the steps of:

providing a semiconductor substrate;

processing of the semiconductor substrate to form a dynamic memory cell array including a plurality of memory cells, each memory cell having a storage capacitor and an access transistor with two source/drain regions and a gate region;

retention annealing of the semiconductor memory cells;

providing a metal layer on the semiconductor substrate, the metal layer covering the memory cell array and electrically contacting one of the source/drain regions of the transistors;

processing the semiconductor substrate to form logic transistor devices adjoining to said memory cells covered by said metal layer, said forming of the logic transistor devices including forming dopant regions, and activating the dopants in the dopant regions by means of laser annealing or flash annealing;

partly removing the metal layer, said remaining parts of the metal layer are contacts to the one source/drain regions of the access transistors; and processing the semiconductor substrate to form a wiring of the memory cells and of the logic transistor devices, said contacts being part of the wiring of the memory cells.

13. The method of claim 12, wherein said metal layer reflects at least 50% of said radiation.

14. The method of claim 12, wherein said metal layer forms an extended cover of said dynamic memory cell array, said metal layer projecting at least 100 nm beyond said dynamic memory cell array.

15. Method of claim 12, wherein the metal layer comprises tungsten.

* * * * *